US010957518B2

(12) United States Patent
Ramaswamy et al.

(10) Patent No.: US 10,957,518 B2
(45) Date of Patent: Mar. 23, 2021

(54) CHAMBER WITH INDIVIDUALLY CONTROLLABLE PLASMA GENERATION REGIONS FOR A REACTOR FOR PROCESSING A WORKPIECE

(71) Applicant: Applied Materials, Inc., Santa Clara, CA (US)

(72) Inventors: Kartik Ramaswamy, San Jose, CA (US); Lawrence Wong, San Jose, CA (US); Steven Lane, Porterville, CA (US); Yang Yang, Los Gatos, CA (US); Srinivas D. Nemani, Sunnyvale, CA (US); Praburam Gopalraja, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/828,694

(22) Filed: Mar. 24, 2020

(65) Prior Publication Data
US 2020/0312630 A1 Oct. 1, 2020

Related U.S. Application Data

(63) Continuation of application No. 14/867,240, filed on Sep. 28, 2015, now abandoned.

(51) Int. Cl.
*H01J 37/32* (2006.01)
*H01H 1/46* (2006.01)

(52) U.S. Cl.
CPC ......... *H01J 37/32449* (2013.01); *H01H 1/46* (2013.01); *H01J 37/3211* (2013.01);
(Continued)

(58) Field of Classification Search
CPC ........... H01J 37/32449; H01J 37/32091; H01J 37/3211; H01J 37/32357; H01J 37/32568; H01H 1/46
See application file for complete search history.

(56) References Cited

U.S. PATENT DOCUMENTS

| 5,683,517 A | 11/1997 | Shari |
| 5,683,548 A | 11/1997 | Hartig et al. |

(Continued)

FOREIGN PATENT DOCUMENTS

| CN | 103620729 A | 3/2014 |
| CN | 103748665 A | 4/2014 |

(Continued)

OTHER PUBLICATIONS

CN Office Action in Chinese Application No. 201610857555.7, dated Apr. 20, 2020, 8 pages (with English Translation).
(Continued)

*Primary Examiner* — Borna Alaeddini
(74) *Attorney, Agent, or Firm* — Fish & Richardson P.C.

(57) ABSTRACT

A plasma reactor includes a processing chamber having a lower processing portion having an axis of symmetry and an array of cavities extending upwardly from the lower processing portion. A gas distributor couples plural gas sources to a plurality of gas inlets of the cavities, and the gas distributor includes a plurality of valves with each valve selectively connecting a respective gas inlet to one of the plural gas sources. Power is applied by an array of conductors that includes a respective conductor for each respective cavity with each conductor adjacent and surrounding a cavity. A power distributor couples a power source and the array of conductors, and the power distributor includes a plurality of switches with a switch for each respective conductor.

13 Claims, 7 Drawing Sheets

(52) U.S. Cl.
CPC .... *H01J 37/3244* (2013.01); *H01J 37/32091* (2013.01); *H01J 37/32357* (2013.01); *H01J 37/32422* (2013.01); *H01J 37/32568* (2013.01); *H01J 2237/334* (2013.01); *H01J 2237/3323* (2013.01)

(56) References Cited

U.S. PATENT DOCUMENTS

| | | | |
|---|---|---|---|
| 5,702,530 | A | 12/1997 | Shan et al. |
| 6,054,013 | A | 4/2000 | Collins et al. |
| 6,267,074 | B1* | 7/2001 | Okumura ............ C23C 16/5096 118/723 ER |
| 6,632,322 | B1 | 10/2003 | Gottscho et al. |
| 7,976,674 | B2* | 7/2011 | Brcka ............... H01J 37/32568 156/345.48 |
| 9,349,619 | B2 | 5/2016 | Kawarnata et al. |
| 9,734,990 | B2 | 8/2017 | Chang et al. |
| 2004/0031564 | A1 | 2/2004 | Gottscho et al. |
| 2008/0309242 | A1 | 12/2008 | Ellingboe |
| 2009/0102385 | A1 | 4/2009 | Wi |
| 2010/0006543 | A1 | 1/2010 | Sawatla et al. |
| 2011/0212624 | A1* | 9/2011 | Hudson ............. H01J 37/32532 438/710 |
| 2012/0132367 | A1* | 5/2012 | Tezuka ................ H01J 37/3244 156/345.33 |
| 2012/0289054 | A1 | 11/2012 | Holland et al. |
| 2013/0157469 | A1* | 6/2013 | Koshiishi ................. H05H 1/46 438/712 |
| 2014/0265846 | A1 | 9/2014 | Zhao et al. |
| 2014/0370715 | A1* | 12/2014 | Chung ............. H01J 37/32174 438/714 |
| 2017/0092470 | A1* | 3/2017 | Ramaswamy .... H01J 37/32091 |

FOREIGN PATENT DOCUMENTS

| | | |
|---|---|---|
| CN | 103843465 | 6/2014 |
| JP | 2000-091320 | 3/2000 |
| JP | 2004-296953 | 10/2004 |
| JP | 2013-051315 | 3/2013 |
| TW | 376531 | 12/1999 |
| TW | 200839924 | 10/2008 |
| TW | 200920192 | 5/2009 |
| WO | WO 2012/142038 | 10/2012 |

OTHER PUBLICATIONS

Guo et al., "Radio-frequency microdlscharge arrays for large-area cold atmospheric plasma generation," Applied Physics Letters, Jan. 20, 2003, 82(3): 337-339.

Office Action in Chinese Application No. 201610857555.7, dated Dec. 13, 2019, 20 pages (with English translation).

Parks et al., "Microdlscharge Arrays: A New Family of Photonic Devices," IEEE Journal on Selected Topics in Quantum Electronics, Jan./Feb. 2002, 8(1): 139-147.

Office Action in Chinese Application No. 201610857555.7, dated Aug. 19, 2019, 16 pages (with English translation).

TW Office Action in Taiwanese Application No. 105116211 dated Nov. 13, 2019, 12 pages (with English search report).

JP Office Action in Japanese Application No. 2016-116738, dated Aug. 13, 2020, 29 pages.

\* cited by examiner

CHAMBER WITH INDIVIDUALLY CONTROLLABLE PLASMA GENERATION REGIONS FOR A REACTOR FOR PROCESSING A WORKPIECE

CROSS-REFERENCE TO RELATED APPLICATIONS

This application is a continuation application of and claims priority to U.S. application Ser. No. 14/867,240, filed on Sep. 28, 2015.

BACKGROUND

Technical Field

The disclosure concerns plasma processing of a workpiece such as a semiconductor wafer, and reduction in process non-uniformities.

Background Discussion

In conventional plasma processing, the processed wafers may suffer from local non uniformities—due non-uniform stress, non-uniform film composition (for a deposition process), non-uniform CD's (critical dimensions of features) due to different etch environments. This could be due to differences among incoming wafers or differences in the characteristic of the processing chamber (e.g., in a carousel style processing chamber where the rotating wafer sees a leading edge and a trailing edge radical dwell time difference or different local temperature).

SUMMARY

A plasma reactor comprises: a processing chamber and a workpiece support in the processing chamber, the chamber comprising a lower ceiling facing the workpiece support; an upper ceiling overlying and facing the lower ceiling and a gas distributor overlying the upper ceiling; plural cavity walls defining plural cavities between the upper and lower ceilings, the gas distributor comprising plural gas flow paths to respective ones of the plural cavities; plural outlet holes in the lower ceiling aligned with respective ones of the plural cavities; and respective power applicators adjacent respective ones of the plural cavities, a power source, plural power conductors coupled to respective ones of the power applicators, and a power distributor coupled between the power source and the plural power conductors.

In one embodiment, the plural cavity walls comprise dielectric cavity walls.

In a further embodiment, the power source comprises an RF power generator and wherein each one of the respective power applicators is separated from an interior of a corresponding one of the plural cavities by the corresponding one of the plural cavity walls.

In one embodiment, the power applicator comprises an electrode for capacitively coupling RF power into the corresponding one of the plural cavities. In this embodiment, each electrode may surround a section of the corresponding one of the plural cavities.

In another embodiment, the power applicator comprises a coil antenna for inductively coupling RF power into the corresponding one of the plural cavities. In this embodiment, the coil antenna may comprise a conductor coiled around a section of the corresponding one of the plural cavities.

In a yet further embodiment, the power source is a D.C. power generator, each one of the power applicators comprises an electrode for D.C. discharge, and wherein each one of the dielectric cavity walls is configured to expose the corresponding electrode to the interior of the corresponding one of the plural cavities.

In one embodiment, the power distributor comprises plural switches coupled between an output of the power generator and respective ones of the power conductors.

In one embodiment, the plasma reactor further comprises a processor controlling the plural switches individually in accordance with user-defined instructions.

In one embodiment, the plasma reactor further comprises a process gas source and a gas distributor comprising plural valves coupled between the process gas source and respective ones of the plural cavities. The process gas source may comprise plural gas sources of different gas species, wherein respective ones of the plural valves are coupled between respective ones of the plural gas sources and respective ones of the plural cavities. In one embodiment, the plasma reactor further comprises a processor controlling the plural valves individually in accordance with user-defined instructions.

In one embodiment, the plasma reactor further comprises a remote plasma source coupled to deliver plasma by-products to the plural cavities.

In one embodiment, the processing chamber further comprises a cylindrical side wall, the reactor further comprising an inductively coupled plasma source comprising a coil antenna wound around the cylindrical side wall and an RF power generator coupled to the coil antenna through an impedance match.

In one embodiment, a plasma reactor comprises: a processing chamber and a workpiece support in the processing chamber; a gas distributor overlying the workpiece support; plural cavity walls defining plural cavities underlying the gas distributor, the gas distributor comprising plural gas flow paths to respective ones of the plural cavities; respective power applicators adjacent respective ones of the plural cavities, a power source, plural power conductors coupled to respective ones of the power applicators, and a power distributor coupled between the power source and the plural power conductors; and a process gas source and a gas distributor comprising plural valves coupled between the process gas source and respective ones of the plural cavities.

In a further embodiment, a method of processing a workpiece in a plasma reactor comprising an array of plasma point sources distributed over a surface of the workpiece, comprises: performing a plasma process on the workpiece; observing a non-uniformity in a spatial distribution of process rate across the surface of the workpiece; and reducing the non-uniformity by performing at least one of:
(a) adjusting an apportionment of plasma source power levels among the array of plasma point sources, or
(b) adjusting an apportionment of gas flows among the array of plasma point sources.

BRIEF DESCRIPTION OF THE DRAWINGS

So that the manner in which the exemplary embodiments of the present invention are attained can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1A:
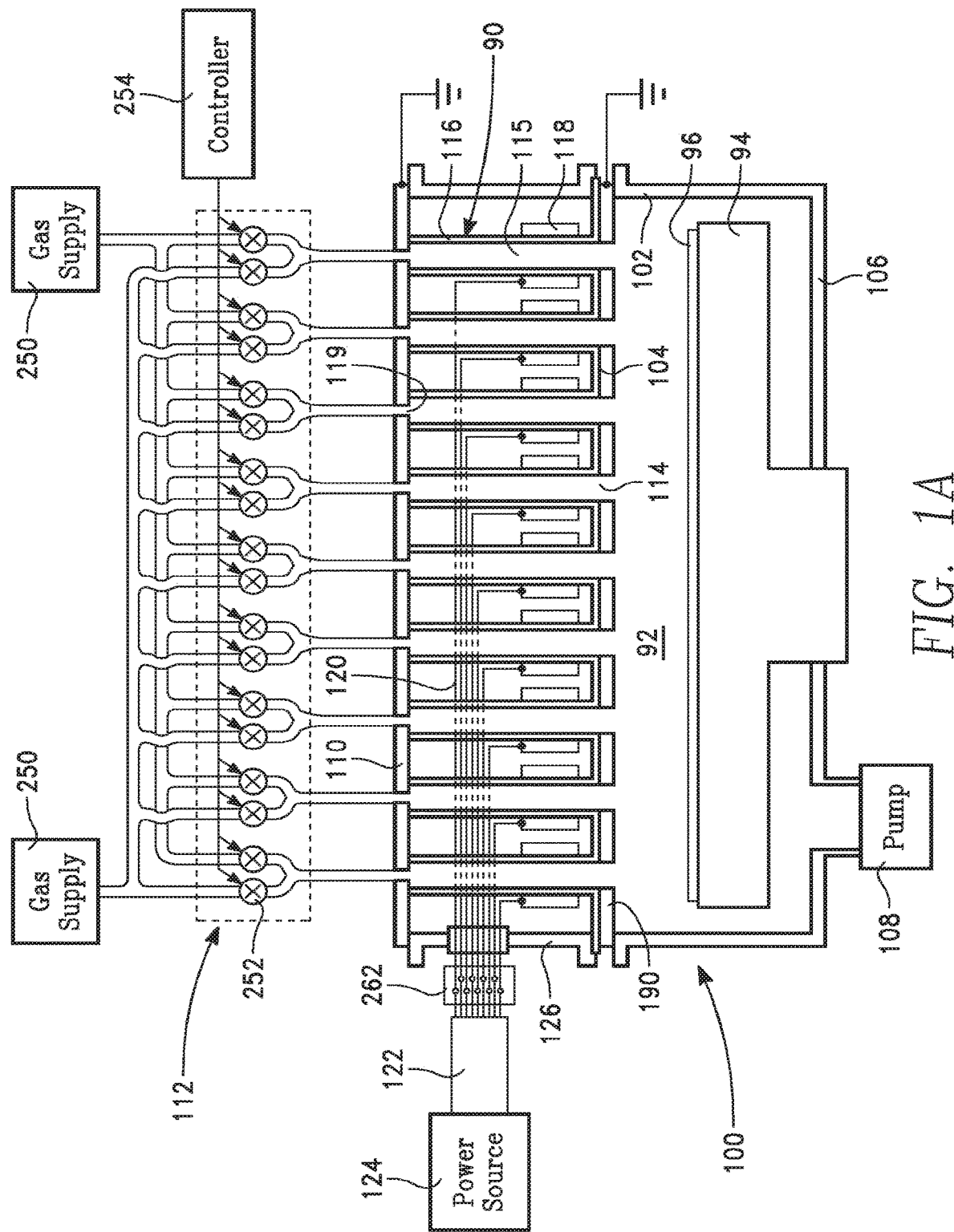
FIG. 1A is a simplified diagram of a first embodiment having an array of plasma point sources.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Introduction

A plasma source consists of a multitude or array of independently controlled local plasma point sources, which allows the spatial and temporal control of charged particle species (electrons, negative and positive ions) and radicals over a user defined region.

Using a plasma source that enables spatial and temporal control enables correction of local non-uniformities. This may be accomplished by switching ON or OFF plasma generation in different plasma point sources where the charged particles and radicals are generated. Alternatively or in addition, this may be accomplished by changing process gas flows to the different plasma point sources. For example, the gas flow may be switched ON or OFF and/or the gas mixture for each plasma point source may be changed. The user can select the gas to be ionized or broken down in the local plasma point source. The user can further select the time or duration of the discharge.

One can alter the local discharge chemistry by either operating in parallel different gas chemistries in different simultaneous local gas discharges (spatial control) or by alternating gas chemistry locally in the same local discharge.

One can subject the entire workpiece (wafer) to a constant negative DC bias but attract ions locally to implant, or etch or deposit.

The array of plasma point sources can be combined with a conventional non-local plasma source (such as a capacitively coupled large electrode plasma source or an inductively coupled plasma source) and, in real time, correct for local non-uniformities in plasma generation.

The array of plasma point sources can be combined with a remote plasma source (e.g., a remote radical source). The radical processing step could be followed by a plasma treatment step where one can vary the composition and local dwell time. Past solutions have focused on local variation of temperature by varying current through local heating elements in the substrate holders. Embodiments described herein add to the existing solution, and enable local chemistries, and affect the generation of charged particles and radicals rather than depending upon only temperatures to speed up reactions.

Embodiments

Figure 1B:
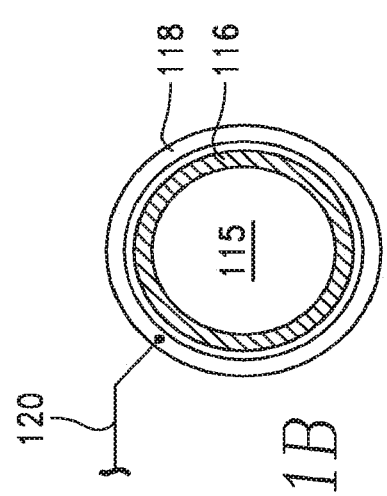
FIG. 1B is an enlarged plan view of a plasma point source in the embodiment of FIG. 1A.
Figure 2B:
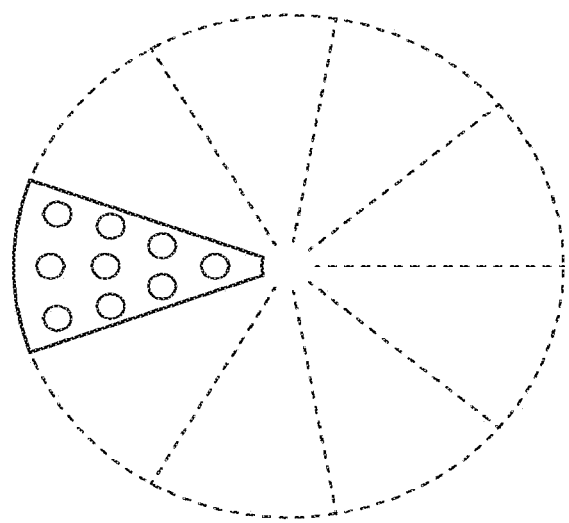
FIGS. 2A and 2B depict different arrangements of an array of plasma point sources.
Figure 2A:
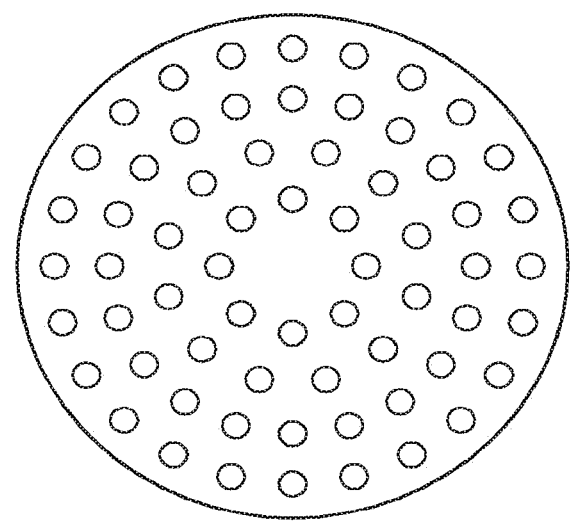

FIGS. 1A and 1B depict an embodiment having multiple plasma point sources 90 that are capacitively coupled using an RF frequency. The point sources 90 can be arranged in various configurations, such as circular (FIG. 2A) or pie shaped (FIG. 2B). The embodiment of FIG. 1A includes a process chamber body 100 having a processing zone 92 enclosed by a cylindrical side wall 102, a lower ceiling 104 and a floor 106. A workpiece support 94 supports a workpiece 96 within the processing zone 92. A vacuum pump 108 may be coupled to the processing zone 92 through the floor 106. An upper ceiling 110 supported on an upper cylindrical side wall 126 overlies the lower ceiling 104 and supports a gas distributor 112. The lower ceiling 104 includes an array of gas outlet holes 114. In the embodiment of FIG. 1A, the point sources 90 are an array of cylindrical cavities 115 enclosed by dielectric cylindrical cavity walls 116, each being parallel to an axis of symmetry of the cylindrical side wall 102 and aligned with a respective one of the gas outlet holes 114. The dielectric cylindrical cavity walls 116 are ringed by respective cylindrical electrodes 118.

Each plasma point source 90 is local, in that the area of each gas outlet hole 114 is small relative to the area of the lower ceiling 104 or the upper ceiling 110 or relative to the diameter of the chamber body 100. In one embodiment, the area of each gas outlet hole 114 does not exceed 5% of the area of the lower ceiling 104 or the upper ceiling 110 or area of the chamber body 100.

In the illustrated embodiment of FIGS. 1A and 1B, the shape of each gas outlet opening 114 is circular and conforms with the shape of the cylindrical cavity 115. However, in other embodiments, each gas outlet hole 114 may be of any shape and may not conform with the shape of the cylindrical cavity 115. For example, each gas outlet hole 114 may be of a non-circular shape (e.g., elliptical) or may be of a polygonal shape or a linear slot shape or combinations of some of the foregoing shapes. If the shape of the gas outlet hole 114 does not conform with the cylindrical cavity 115, then an adapter (not illustrated) may be introduced to provide a gas seal between the gas outlet hole 114 and the cylindrical cavity 115, in one embodiment.

The upper ceiling 110 has an array of gas inlet openings 119 each aligned with a respective one of the cylindrical cavities 115. The gas distributor 112 furnishes process gases into the cylindrical cavities 115 through the gas inlet openings 119. Individual power conductors 120 conduct power to individual ones of the respective cylindrical electrodes 118. A power distributor 122 distributes power to the power conductors 120 from a power source 124. In one embodiment, the power source 124 is an alternating current (AC) power generator or a radio frequency (RF) power generator with an RF impedance match. In related embodiments, the frequency of the power source 124 may be any from D.C. to UHF, for example. In one embodiment, plasma is produced in the cylindrical cavities 115 by capacitive coupling of RF power from the cylindrical electrodes 118 through the dielectric cylindrical cavity walls 116 into the cylindrical cavities 115. The lower ceiling 104 isolates the cylindrical electrodes 118 from plasma.

The gas distributor 112 receives different gas species from plural gas supplies 250, which can thus act as gas sources, and apportions different gas mixtures to different ones of the cylindrical cavities 115 through the respective gas inlet openings 119 in accordance with different user-specified gas recipes for the different cylindrical cavities 115. For example, the gas distributor 112 may include an array of gas valves 252 individually controlled by a processor 254 in accordance with user-defined instructions that define gas mixtures for the individual cylindrical cavities 115. The array of gas valves 252 is coupled between the plural gas supplies 250 and the gas inlet openings 119 to the cylindrical cavities 115.

The power distributor 122, in one embodiment, controls the power supplied to each power conductor 120 individually. For example, the power distributor 122 may include an array of electrical switches 262 individually controlled by the processor 254 in accordance with user-defined instructions. The power may be controlled by pulse width modulation, and the user-defined instructions may define individual on/off durations (or duty cycles) of power for the individual cylindrical cavities 115. The array of electrical switches 262 is coupled between the power source 124 and the power conductors 120.

In a first embodiment, the lower ceiling 104 is formed of a dielectric material while the upper ceiling 110 is formed of a conductive material. In a second embodiment, the lower ceiling 104 is adjacent a lower plate 190 formed of a conductive material, and both the lower plate 190 and the upper ceiling 110 are grounded. In this way, the plasma source is located between two grounded plates, namely the lower plate 190 and the upper ceiling 110.

Figure 3:
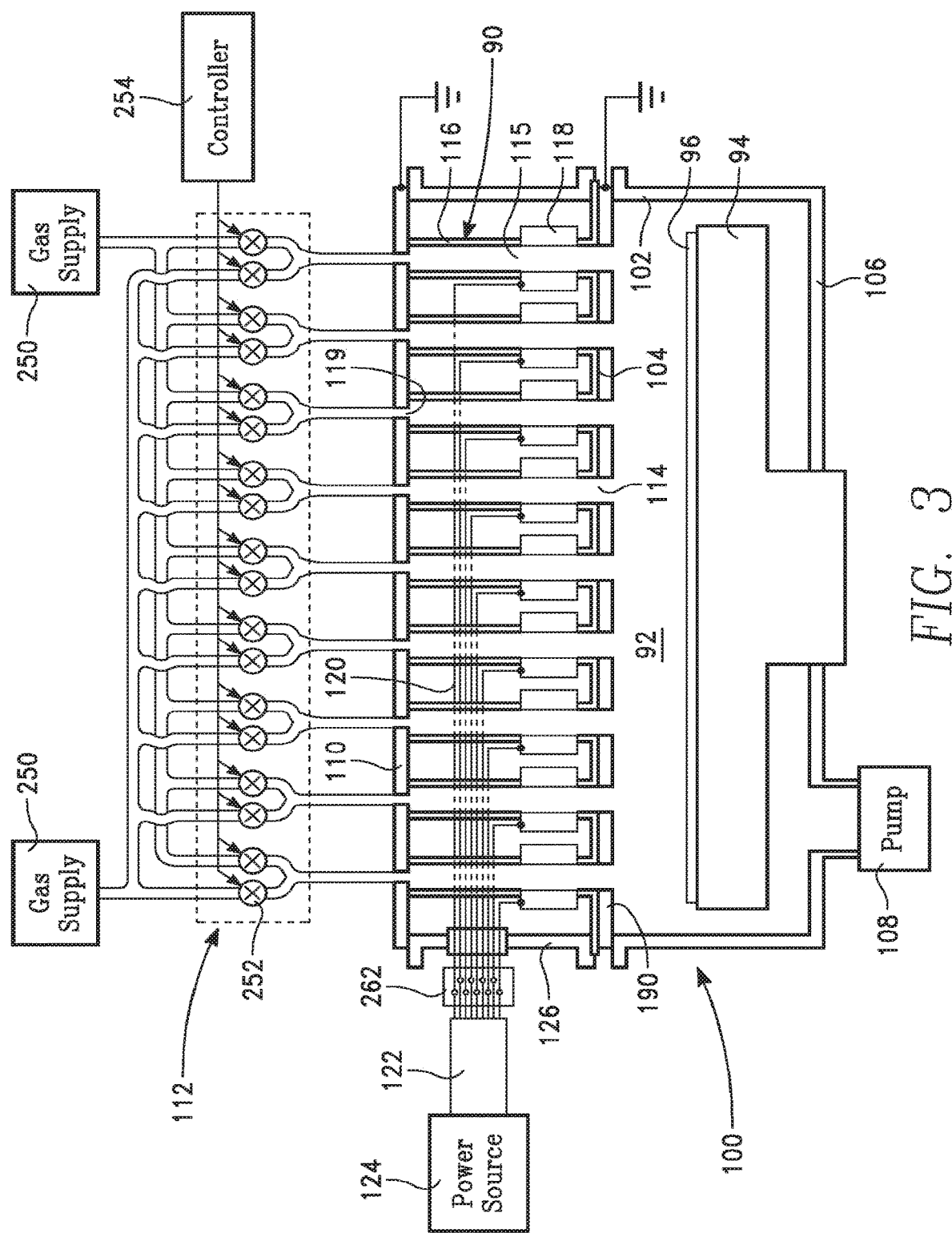
FIG. 3 depicts an embodiment in which the plasma point sources employ plasma D.C. discharge.

FIG. 3 depicts an embodiment in which plasma is produced by a D.C. discharge, and the power source 124 is a D.C. power generator. Each of the dielectric cylindrical cavity walls 116 is terminated above the corresponding one of the cylindrical electrodes 118. This feature can directly expose each cylindrical electrode 118 to plasma to facilitate the D.C. discharge.

Figure 4:
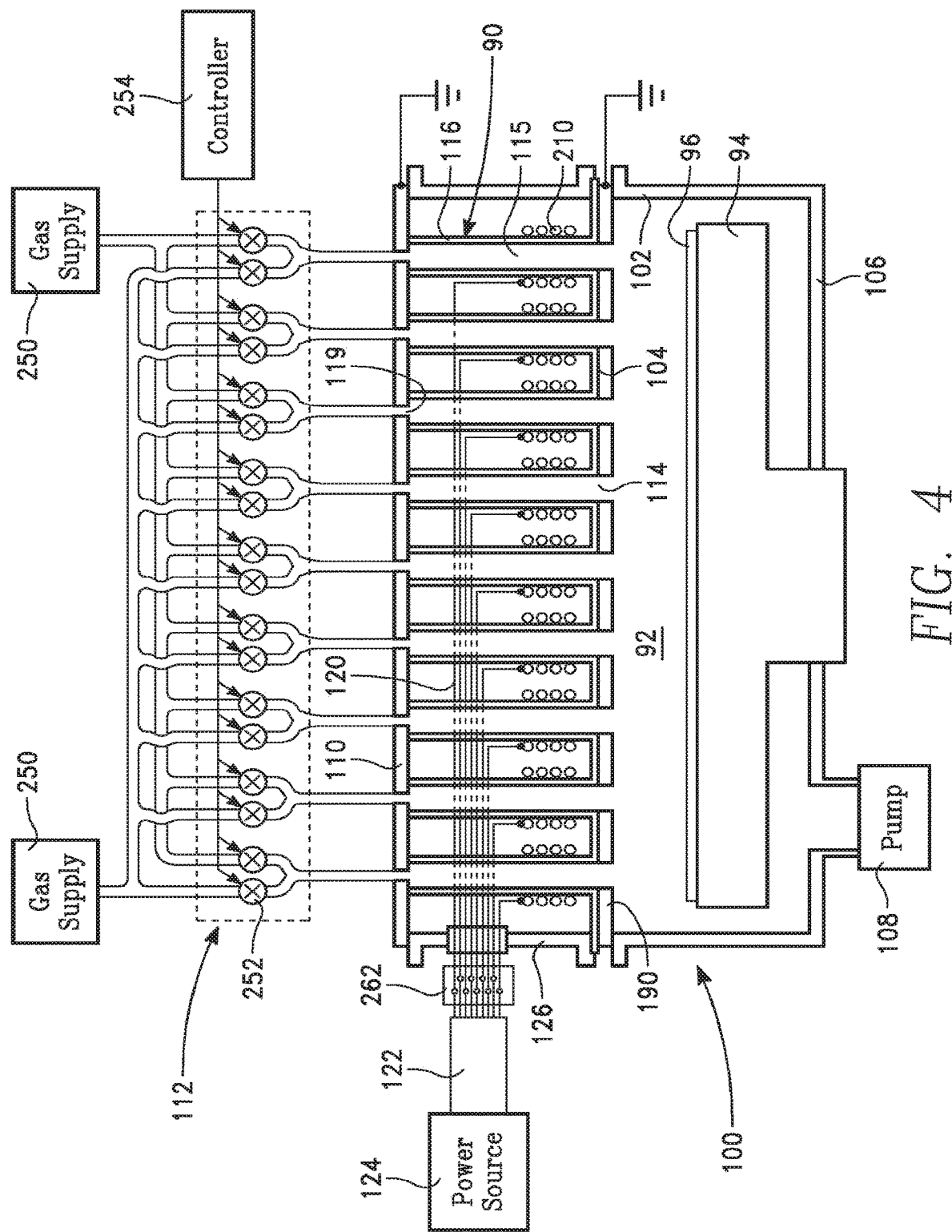
FIG. 4 depicts an embodiment in which the plasma point sources employ inductive coupling.

FIG. 4 depicts a modification of the embodiment of FIG. 1A, in which the cylindrical electrodes 118 are replaced by individual inductive coils 210, to produce an inductively coupled plasma within each cylindrical cavity 115. Each inductive coil 210 is wrapped around a bottom section of the corresponding cylindrical dielectric wall 116, as depicted in FIG. 4. In the embodiment of FIG. 4, a changing magnetic field generates a changing electric field in the cylindrical cavity 115 which in turn generates a closed turn oscillating plasma current.

Figure 5:
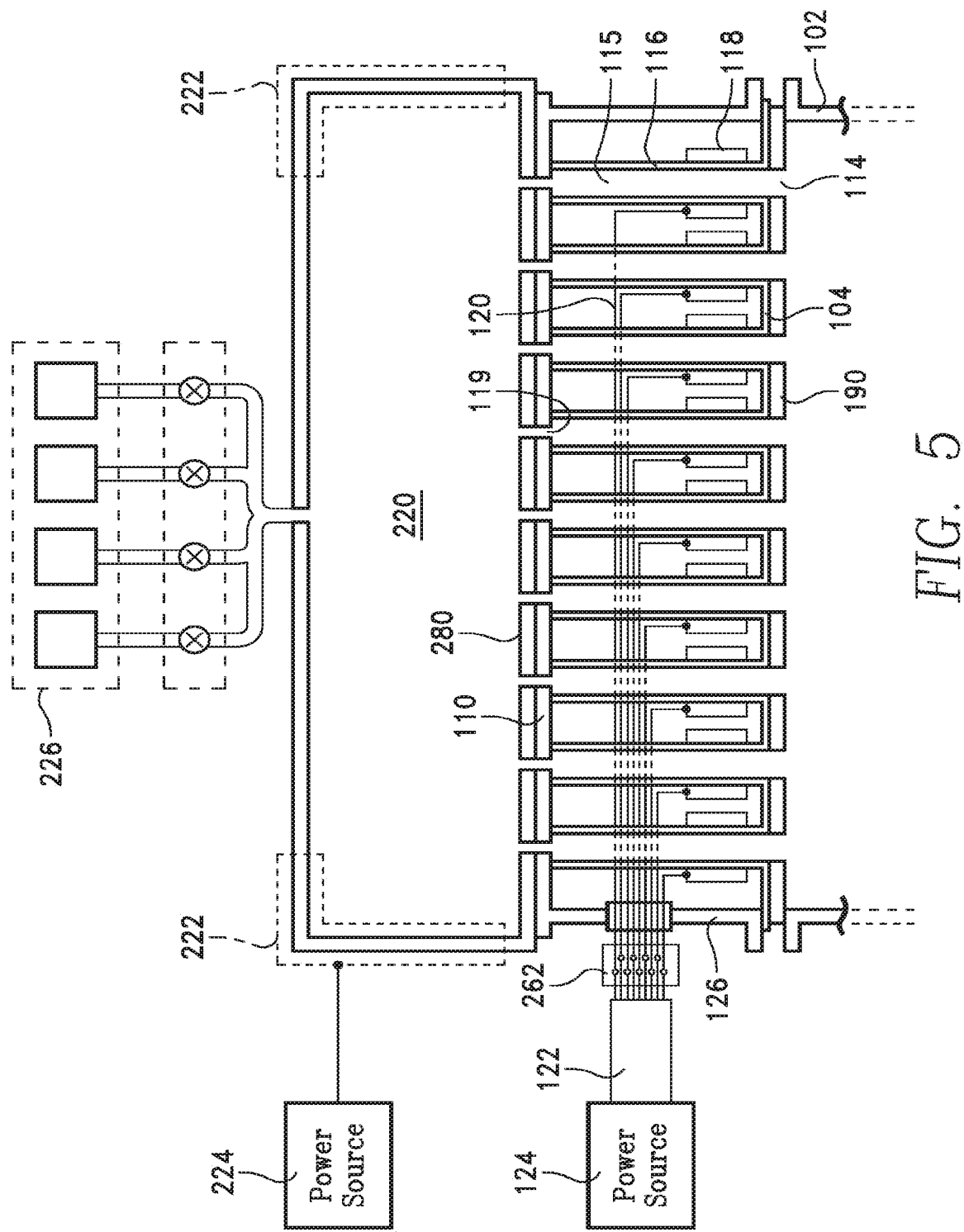
FIG. 5 depicts a modification of the embodiment of FIG. 1A employing a remote plasma source.

FIG. 5 depicts another modification of the embodiment of FIG. 1A that includes a remote plasma source 220 and a radical distribution plate 280. The radical distribution plate 280 directs radicals from the remote plasma source 220 into the individual cylindrical cavities 115. The remote plasma source 220 may include a plasma source power applicator 222 driven by a power source 224. The remote plasma source 220 may further include controlled gas sources 226 containing precursors of desired radical species. There are some processes in which chemically active radicals generated remotely play a critical role in the processing of wafers. However, there may be a need to follow the radical treatment with a plasma treatment step. Having a spatially and temporally controllable plasma source helps in addressing radical non-uniformity. In the case of radicals which are short lived (recombine into inert neutrals), having a controllable plasma density can help regenerate important radicals.

Figure 6:
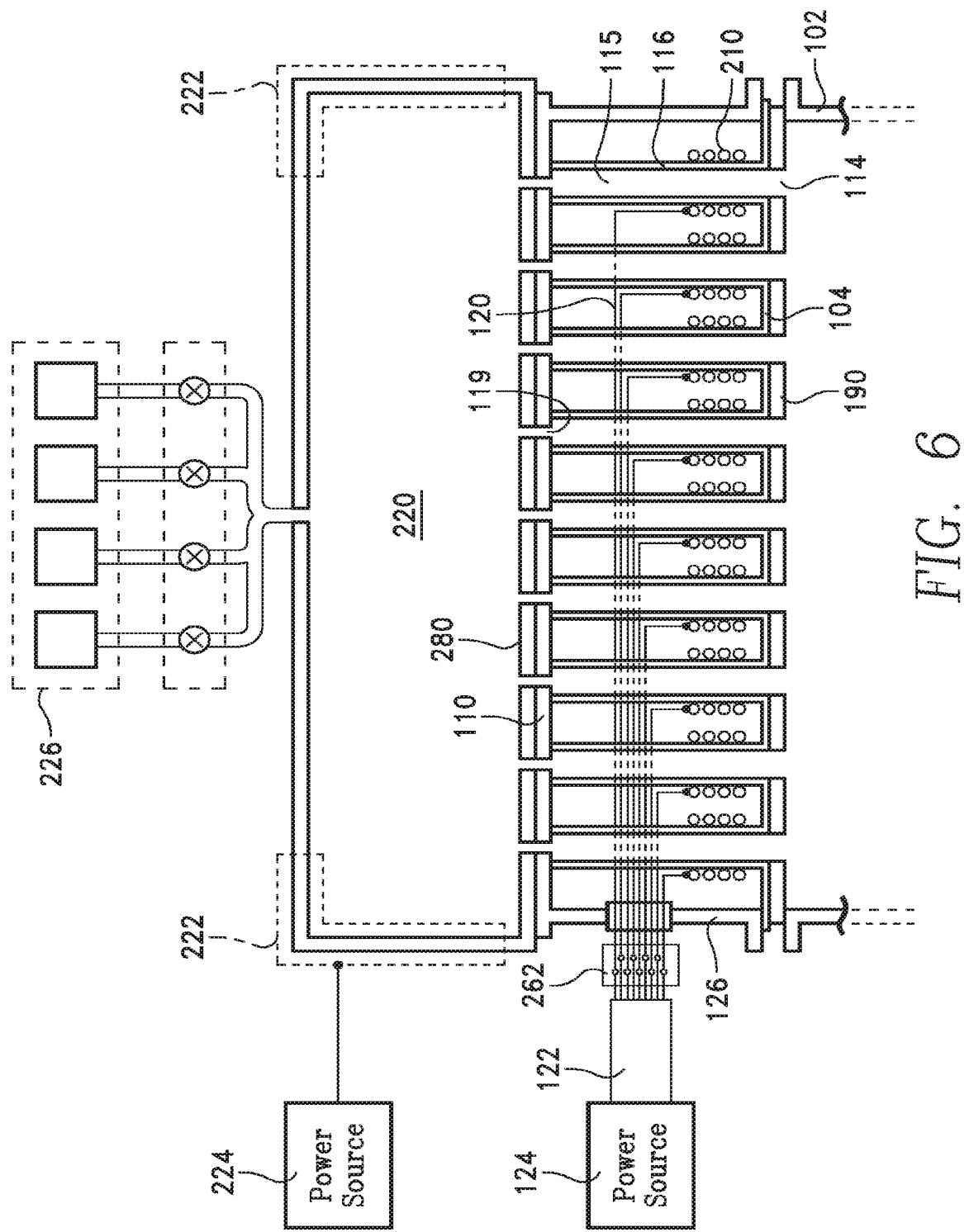
FIG. 6 depicts a modification of the embodiment of FIG. 4 employing a remote plasma source.

FIG. 6 depicts a modification of the embodiment of FIG. 4 that includes a remote plasma source 220 and a radical distribution plate 280. In the embodiment of FIG. 6, the remote plasma source 220 is combined with the inductively coupled plasma sources (i.e., the inductively coupled coils 210) of FIG. 4. The inductively coupled plasma sources (the coils 210) enable operation in different (lower) pressure regimes (e.g., below 25 mTorr), compared to the capacitively coupled plasma source of the embodiment of FIG. 1A.

Figure 7:
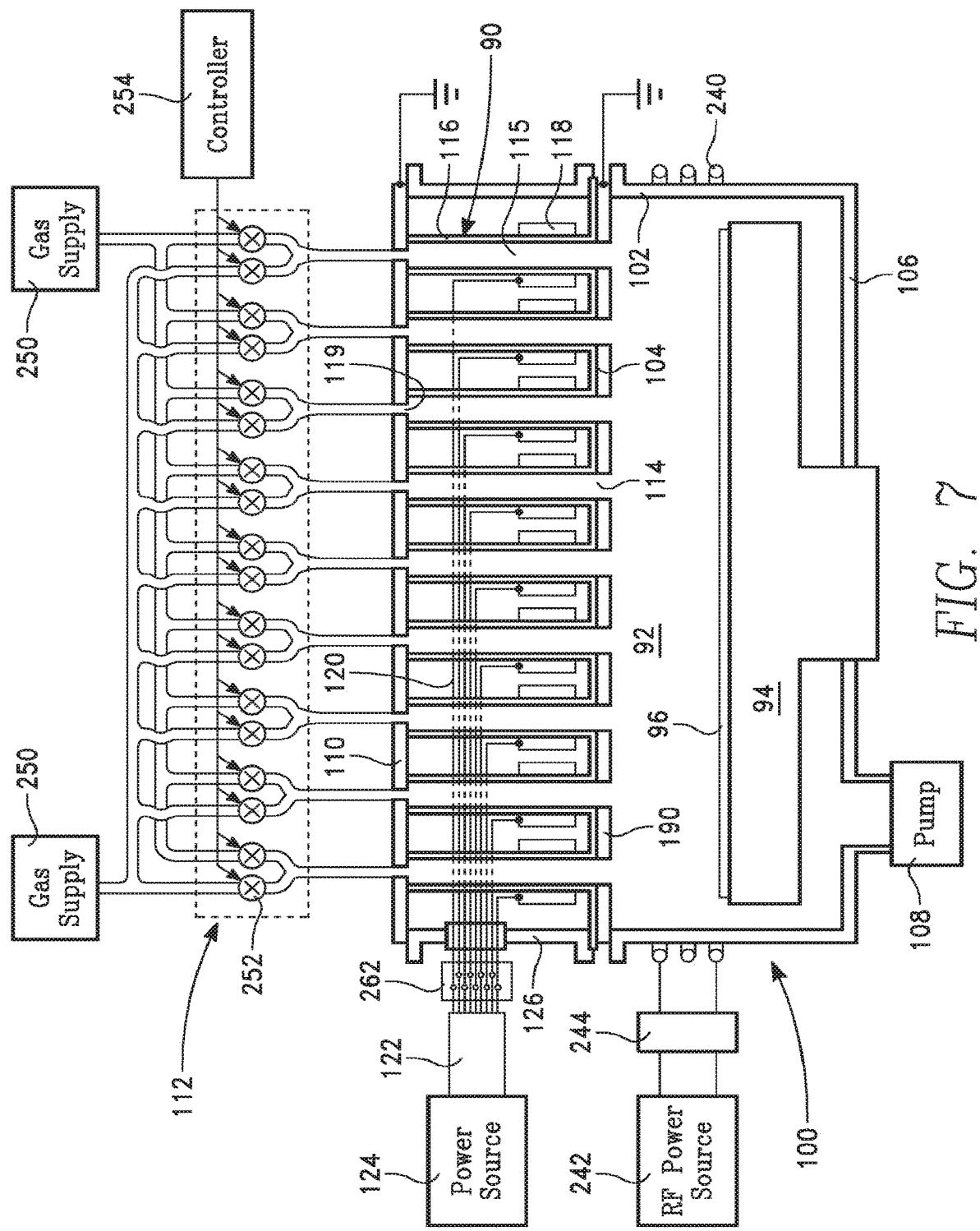
FIG. 7 depicts a modification of the embodiment of FIG. 1A having a chamber-wide inductively coupled source in addition to the array of plasma point sources.

FIG. 7 depicts a modification of the embodiment of FIG. 1A, in which the array of plasma point sources 90 is combined with a larger non-local inductively coupled plasma source. The non-local inductively coupled plasma source of FIG. 7 includes a helically wound coil antenna 240 surrounding the cylindrical side wall 102. The helically wound coil antenna 240 is driven by an RF power generator 242 through an RF impedance match 244. In the embodiment of FIG. 7, the cylindrical side wall 102 is formed of a non-metallic material to enable inductive coupling of RF power through the cylindrical side wall 102. The lower plate 190 protects the individual plasma point sources (corresponding to the individual cylindrical cavities 115) from the larger inductively coupled plasma source (corresponding to the helically wound coil antenna 240).

The individual plasma point sources 90 (corresponding to the individual cylindrical cavities 115) are individually controllable. This enables spatial and temporal control of plasma distribution. Such control may be exercised in such a manner as to reduce plasma distribution non-uniformity.

Control Modes:

The power source 124 can power each plasma point source 90 in different modes. In a first mode, each plasma point source 90 dissipates a fixed amount of power and the control system switches on or off the power furnished to the plasma point source using the array of electrical switches 262. In one example, each point source dissipates a constant amount of about 3 watts when it is on. The array of electrical switches 262 essentially apply the power to individual plasma point sources 90 on command. The plasma density is a function of how many plasma point sources 90 are turned on. In this manner, the net power delivered to each plasma point source 90 may be controlled by pulse width modification.

In a second mode, what is controlled is the level of power delivered to each plasma point source 90. Also, gas composition to individual plasma point sources 90 (or groups of plasma point sources 90) can be varied by the gas distributor 112. Thus, the different plasma point sources 90 need not have the same gas discharge composition. Each plasma point source 90 has a fixed address. The power and/or gas flow to each plasma point source 90 can be targeted to turn on or off individually.

In accordance with one method, the spatial distribution of process rate across the surface of the workpiece is measured. The non-uniformities in the process rate distribution are compensated by establishing a spatial distribution of ON/OFF duty cycles of power supplied to the array of plasma point sources 90 that is in effect an inverse of the measured process rate spatial distribution. In other words, the distribution of ON/OFF power duty cycles has maxima in locations where the measured process rate distribution has minima and has minima where the measured process rate distribution has maxima.

In accordance with another method, the non-uniformities in the process rate distribution are compensated by establishing a spatial distribution of ON/OFF duty cycles of process gas flows supplied to the array of plasma point sources 90 that is in effect an inverse of the measured process rate spatial distribution. In other words, the distribution of ON/OFF gas flow duty cycles has maxima in locations where the measured process rate distribution has minima and has minima where the measured process rate distribution has maxima.

Advantages:

A primary advantage is complete control spatially and temporally of the generation of charged particles and energetic radicals. This enables spatial and temporal control over distribution of local charged particles and energetic radicals.

While the foregoing is directed to embodiments of the present invention, other and further embodiments of the invention may be devised without departing from the basic scope thereof, and the scope thereof is determined by the claims that follow.

What is claimed is:

1. A plasma reactor comprising:
   a processing chamber having a lower processing portion having an axis of symmetry and an array of cavities extending upwardly from the lower processing portion, each cavity being elongated and extending parallel to the axis of symmetry of the lower processing portion, each cavity positioned exterior to each other cavity;
   a workpiece support in the lower processing portion of the processing chamber,
   plural gas sources of different gas species;
   a plurality of gas inlets with each gas inlet opening into a respective cavity;
   a gas distributor coupling the plural gas sources to the plurality of gas inlets, wherein the gas distributor includes a plurality of valves with a respective valve for each respective gas inlet, and wherein each respective valve selectively connects the respective gas inlet to one of the plural gas sources;
   a power source;
   an array of conductors that includes a respective conductor for each respective cavity, wherein each respective conductor is adjacent and surrounds a respective single cavity of the array of cavities;
   a power distributor coupled between the power source and the array of conductors, wherein the power distributor includes a plurality of switches coupled between an output of the power source and the array of conductors, the plurality of switches including a switch for each respective conductor; and
   a processor controlling the plurality of valves individually and controlling the plurality of switches individually in accordance with user-defined instructions so as to provide independent control of gas species and plasma generation in each cavity of the array of cavities extending upwardly from the lower processing portion of the processing chamber.

2. The plasma reactor of claim 1 wherein the processing chamber comprises a plurality of dielectric cavity walls that define the array of cavities that extend upwardly from the lower processing portion.

3. The plasma reactor of claim 2, wherein the processing chamber comprises a conductive lower plate secured to lower edges of the plurality of dielectric cavity walls and that provides a ceiling for the lower processing portion.

4. The plasma reactor of claim 3, wherein the processing chamber comprises a conductive upper plate secured to upper edges of the plurality of dielectric cavity walls and that provides a ceiling for the array of cavities.

5. The plasma reactor of claim 2, wherein the power source comprises an RF power generator and each respective conductor is separated from an interior of a corresponding respective cavity by a corresponding respective one of the dielectric cavity walls.

6. The plasma reactor of claim 5, wherein the array of conductors is an array of electrodes to capacitively couple RF power into the array of cavities.

7. The plasma reactor of claim 6, wherein each electrode of the array of electrodes forms a cylinder having an axis parallel to the axis of symmetry and surrounding the respective cavity.

8. The plasma reactor of claim 5, wherein the array of conductors is an array of coil antennas to inductively couple RF power into the array of cavities.

9. The plasma reactor of claim 8, wherein each coil antenna of the array of coil antennas forms a coil wound in a cylinder having an axis parallel to the axis of symmetry.

10. The plasma reactor of claim 1, wherein the processing chamber comprises a plurality of conductive cavity walls that define portions of the array of cavities that extend upwardly from the lower processing portion, the conductive cavity walls providing the array of conductors.

11. The plasma reactor of claim 10, wherein the power source is a D.C. power generator and each conductor of the array of conductors is an electrode for D.C. discharge.

12. The plasma reactor of claim 10, wherein the processing chamber comprises a plurality of dielectric cavity walls with dielectric cavity walls positioned above and below the conductive cavity walls.

13. The plasma reactor of claim 1, wherein the processing chamber includes a cylindrical side wall, and the plasma reactor further comprises an inductively coupled plasma source including a coil antenna wound around the cylindrical side wall and an RF power generator coupled to the coil antenna through an impedance match.

* * * * *